United States Patent
Matsui

(10) Patent No.: US 7,898,328 B2
(45) Date of Patent: Mar. 1, 2011

(54) DIFFERENTIAL AMPLIFIER

(75) Inventor: Naohiro Matsui, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/591,933

(22) Filed: Dec. 4, 2009

(65) Prior Publication Data

US 2010/0148868 A1 Jun. 17, 2010

(30) Foreign Application Priority Data

Dec. 15, 2008 (JP) .............................. 2008-317769

(51) Int. Cl.
*H03F 3/45* (2006.01)
(52) U.S. Cl. ...................................... 330/253; 330/260
(58) Field of Classification Search .................. 330/253, 330/260, 261
See application file for complete search history.

(56) References Cited

U.S. PATENT DOCUMENTS

| | | | | |
|---|---|---|---|---|
| 5,838,200 A | * | 11/1998 | Opris | 330/258 |
| 5,864,257 A | * | 1/1999 | Rothenberg | 330/253 |
| 6,469,579 B2 | * | 10/2002 | Bazes | 330/253 |
| 6,781,451 B2 | * | 8/2004 | Kwan et al. | 330/9 |
| 6,963,246 B2 | * | 11/2005 | Sugimura | 330/260 |

OTHER PUBLICATIONS

Thomas H. Lee, "The Design of CMOS Radio-Frequency Integrated Circuit," 2nd Edition, p. 387, 2004, Cambridge University Press.

* cited by examiner

*Primary Examiner*—Henry K Choe
(74) *Attorney, Agent, or Firm*—McGinn IP Law Group, PLLC

(57) ABSTRACT

In a wireless communications system, it is important to realize a limiter operation by which a differential amplifier for amplifying a local signal may stably supply an output signal having a constant amplitude. However, when a signal handled by the system has a high frequency, a gain of the differential amplifier is reduced and the limiter operation may not be performed appropriately. The differential amplifier is configured employing a double cascode connection to enhance an output impedance, an upper transistor of the double cascode connection realizes enhancement in gain and frequency characteristics based on a positive feedback signal, and a lower transistor of the double cascode connection controls an operating point and suppresses an allowable output voltage range by operating in a linear region and based on a negative feedback signal to facilitate the limiter operation.

8 Claims, 15 Drawing Sheets

$Z_1$ TO $Z_6$ : AMPLIFIER CIRCUIT LOAD IMPEDANCE RESISTANCE / INDUCTANCE
$Z_{F1}$ TO $Z_{F4}$ : FEEDBACK SIGNAL IMPEDANCE
$Z_{out}$ : OUTPUT LOAD IMPEDANCE $Z_1$ TO $Z_6$ : AMPLIFIER CIRCUIT LOAD IMPEDANCE RESISTANCE / INDUCTANCE
$Z_{F1}$ TO $Z_{F4}$ : FEEDBACK SIGNAL IMPEDANCE
$Z_{out}$ : OUTPUT LOAD IMPEDANCE $Z_1$ TO $Z_2$ : AMPLIFIER CIRCUIT LOAD IMPEDANCE
RESISTANCE / INDUCTANCE

PRIOR ART (IN CASE OF RESISTOR LOAD)

_US 7,898,328 B2_

DIFFERENTIAL AMPLIFIER

BACKGROUND OF THE INVENTION

1. Field of the Invention

The present invention relates to a differential amplifier, and more particularly, to a differential amplifier that performs a limiter operation and needs to operate at a high frequency and in a wide band.

2. Description of the Related Art

In recent years, through an improvement in microprocessing technology for manufacturing semiconductor devices, a complementary metal-oxide semiconductor (CMOS) transistor has found its use in a radio frequency (RF) circuit using a gigahertz frequency band, thereby becoming available to form the RF circuit for handling a high frequency band signal and a circuit for handling a baseband signal on one chip.

FIG. 10 illustrates a configuration of a transceiver system of a terminal for wireless communications using frequency bands of several gigahertz. Note that in FIG. 10, each of a transmitter circuit and a receiver circuit has one signal line. However, any one of the transmitter circuit and the receiver circuit may have two signal lines, and a signal flowing through the two signal lines may be a differential signal. Here, taking an operation of the receiver circuit as an example, an antenna 1001 receives a signal transmitted from a transmitting terminal. The received signal is input to a radio frequency variable gain amplifier (RF-VGA) 1004 through a band-pass filter (BPF) 1002 and a switch 1003. In the RF-VGA 1004, the received signal is adjusted in its power, and then input to a mixer 1005 provided in a subsequent stage. The mixer 1005 is a circuit having a function of converting a frequency of the signal received from the RF-VGA 1004. In addition to the signal from the RF-VGA 1004, the mixer 1005 also receives a local signal generated by a phase-locked loop (PLL) 1015 and a voltage-controlled oscillator (VCO) 1016. The local signal is adjusted in its power by a differential amplifier 1017. The mixer 1005 multiplies the signal from the RF-VGA 1004 by the local signal. Through the multiplication, the mixer 1005 generates a signal having a frequency obtained by adding a frequency of the signal from the RF-VGA 1004 and a frequency of the local signal, and a signal having a frequency obtained by subtracting the frequency of the local signal from the frequency of the signal from the RF-VGA 1004, and outputs the signals to a low-pass filter 1006.

The low-pass filter 1006 outputs, for example, only the signal having the frequency obtained by subtracting the frequency of the local signal from the frequency of the signal from the RF-VGA 1004, of the signals output by the mixer 1005, to an intermediate frequency variable gain amplifier (IF-VGA) 1007 in a subsequent stage. The signal output by the low-pass filter 1006 is a signal having a baseband frequency. After that, the signal is adjusted in its power by the IF-VGA 1007, and then input to a demodulation circuit 1008. The demodulation circuit 1008 demodulates the received signal. A description of an operation of the transmitter circuit is omitted, but a mixer 1011 and a differential amplifier 1018, in particular, operate similarly to the mixer 1005 and the differential amplifier 1017 in the receiver circuit.

Reference is made to THOMAS H. LEE "The Design of CMOS Radio-Frequency Integrated Circuit" 2nd Edition P387 2004 Cambridge University Press for a specific circuit configuration applied to each of the differential amplifiers 1017 and 1018 of FIG. 10. FIG. 11 illustrates the specific circuit configuration of the differential amplifier. Circuit elements constituting the differential amplifier are provided between a power supply line, which supplies a power supply voltage VDD, and a ground line, which defines a reference potential. A load $Z_1$ connected to the power supply line and a load $Z_2$ connected in parallel with the load $Z_1$ are necessary for the differential amplifier to operate, and each includes, for example, a resistor or an inductor. Two transistors NM41 and NM43 connected in series with the load $Z_1$ are n-type MOS transistors. Two transistors NM42 and NM44 connected in series with the load $Z_2$ are also n-type MOS transistors. A predetermined voltage V is applied to gate terminals of the MOS transistors NM43 and NM44. A signal from an input terminal Vin+ is applied to a gate terminal of the MOS transistor NM41, and a signal from an input terminal Vin− is applied to a gate terminal of the MOS transistor NM42. In the differential amplifier, an alternate current (AC) signal that oscillates with a predetermined amplitude is applied to each of the terminals Vin+ and Vin−. For example, the signal from the terminal Vin+ may be a sine wave, and the signal from the terminal Vin− may be a wave that has a phase different from the sine wave by 180°. Further, terminals Vout+ and Vout− are output terminals of the differential amplifier, and the terminal Vout− outputs a signal having an amplitude amplified with respect to the signal from the terminal Vin+ by a predetermined gain. In addition, the terminal Vout+ outputs a signal having an amplitude amplified with respect to the signal from the terminal Vin− by a predetermined gain. A load $Z_{out}$ connected to each of the output terminals Vout+ and Vout− includes a parasitic capacitance of a wiring connected to the output terminal and an input impedance of a circuit in a subsequent stage that uses the output signal from the output terminal, and has a capacitive impedance as a whole.

FIGS. 12A to 12C are graphs for illustrating an operation principle of the differential amplifier. Assume here that each of the loads $Z_1$ and $Z_2$ is a resistor having a resistance R, and a value of a current output from a constant current source is Ic. Assume now that a sine wave is input to the input terminal Vin+ as illustrated in FIG. 12A. Then, a waveform as illustrated in FIG. 12B is output from the output terminal Vout−. The waveform illustrated in FIG. 12B is amplified in its power compared to the waveform illustrated in FIG. 12A.

In this case, the signal input to the terminal Vin+ and the signal output from the terminal Vout− have phases different from each other. In FIGS. 12A and 12B, the signals may be regarded as having phases different from each other by 180°. This is because if the NMOS transistor NM43 is turned ON by the voltage V, a voltage drop amount at the output terminal Vout− caused by the load $Z_1$ becomes larger as a voltage value of the signal from the terminal Vin+ becomes higher and a higher voltage is applied to the gate of the NMOS transistor NM41 to cause a larger current to flow between a source and a drain of the NMOS transistor NM41. This is also because the voltage drop amount at the output terminal Vout− caused by the load $Z_1$ becomes smaller as the voltage value of the signal from the terminal Vin+ becomes lower and a lower voltage is applied to the gate of the NMOS transistor NM41 to cause a smaller current to flow between the source and the drain of the NMOS transistor NM41. In other words, as the amplitude of the signal input to the terminal Vin+ is increased, the amplitude of the signal output from the output terminal Vout− is decreased, and as the amplitude of the signal input to the terminal Vin+ is decreased, the amplitude of the signal output from the output terminal Vout− is increased. With the signal input to the terminal Vin+ and the signal output from the terminal Vout− changing in amplitude as described above, signal waveforms as illustrated in FIG. 12A and FIG. 12B may be obtained. Note that as illustrated in FIG. 12C, the signal output from the terminal Vout+ and the signal input to the terminal Vin+ have the same phase. This is because the signal input to the terminal Vin− and the signal input to the terminal Vin+ have phases different from each other by 180°. This phase relationship makes the signal input to the terminal Vin+ and the signal output from the terminal Vout+ have the same phase.

As described above, FIG. 10 illustrates the transceiver system of the terminal for wireless communications, and in designing such system, it is desired to limit the value of the signal input to the demodulation circuit 1008 to a certain range. This is because when a signal having a large amplitude above the certain range or a signal having an amplitude that is within the certain range but too small is input to the demodulation circuit 1008, desired characteristics are not obtained, resulting in deteriorated characteristics due to the system design. For example, when the signal having the large amplitude as described above is input to the demodulation circuit 1008, the waveform input to the demodulation circuit 1008 is distorted because a circuit in an input stage of the demodulation circuit 1008 is not designed to process the signal having such large amplitude. This waveform distortion makes it impossible to obtain the desired characteristics. On the other hand, for example, in the case of the signal having the small amplitude as described above, the waveform input to the demodulation circuit 1008 is buried in noise due to a low signal to noise (S/N) ratio and the demodulation circuit 1008 may not be able to successfully process the input signal. For those reasons, it is necessary to ensure in design that the amplitude of the signal input to the demodulation circuit 1008 is within the certain range. In order to attain this, it is important to determine gains of the RF-VGA 1004, the mixer 1005, the low-pass filter 1006, and the IF-VGA 1007 with respect to the signal received through the antenna. In this case, the RF-VGA 1004 and the IF-VGA 1007 have two functions of absorbing variation in gain among circuit elements when the system is manufactured as a semiconductor integrated circuit, and of adjusting a system gain with respect to a level of the received signal, to thereby adjust the gain of the entire system. As a result of the adjustment, the gains of the RF-VGA 1004 and the IF-VGA 1007 are uniquely determined. The gain of the low-pass filter 1006 is also uniquely determined according to its circuit configuration (the low-pass filter has a negative gain so as to attenuate the signal). However, the gain of the mixer 1005 with respect to the signal received through the antenna is not uniquely determined by merely determining its circuit configuration. This is because the gain of the mixer 1005 depends also on the local signal which is output from the differential amplifier 1017 and input to the mixer 1005. As described above, the mixer 1005 multiplies the signal received through the antenna by the local signal output from the differential amplifier 1017. This multiplication not only converts the frequency of the signal received through the antenna, but also changes the amplitude of the signal received through the antenna. Therefore, the gain of the mixer 1005 with respect to the signal received through the antenna changes with the change in amplitude of the local signal. This is disadvantageous in limiting the amplitude of the signal input to the demodulation circuit 1008 to the certain range, and hence it is necessary to uniquely determine the gain of the mixer 1005.

The gain of the mixer 1005 with respect to the signal received through the antenna may be uniquely determined when the amplitude of the local signal output from the differential amplifier 1017 is set constant. This is because when the amplitude of the local signal is constant, the gain of the mixer 1005 may be uniquely determined and stabilized according to its circuit configuration. For this purpose, there is known a limiter operation of the differential amplifier that makes the amplitude of its output signal constant. The limiter operation using the differential amplifier of FIG. 11, for example, is described with reference to FIGS. 12A to 12C. Assume that each of the loads $Z_1$ and $Z_2$ is a resistor having a resistance R. As illustrated in FIGS. 12B and 12C, each of the signals output from the output terminals Vout+ and Vout− of the differential amplifier of FIG. 11 in this case has a maximum value of VDD. This is because the voltage drop from the power supply voltage VDD is used to change the values of the signals from the output terminals Vout+ and Vout− of the differential amplifier of FIG. 11. Therefore, in this case, the amplitude values of the signals output from the differential amplifier do not exceed the power supply voltage VDD.

Meanwhile, a center of oscillation of each of the signals output from the output terminals Vout+ and Vout− is VDD−R (Ic/2). This is because in a steady state where a constant direct current (DC) voltage is applied to the input terminals Vin+ and Vin− to cause the same source-drain current to flow through the MOS transistors NM41 and NM43 and the MOS transistors NM42 and NM44, the current Ic output from the constant current source is divided in half. The signals as illustrated in FIG. 12B and FIG. 12C are desirably taken out from the output terminals by increasing and decreasing the constant DC voltage input to the input terminals Vin+ and Vin− at a constant frequency by the differential amplifier in this steady state.

In the viewpoint of the operation of the differential amplifier as a whole, when the current Ic is allowed to flow through the entire circuit and the constant current source has a resistance RD, the constant current source having the resistance RD generates a potential Ic*RD with respect to a ground (GND) reference (0 V) as illustrated in FIG. 13. Further, the input transistors NM41 and NM42 operate in a saturation region and consume a predetermined source-drain voltage Vds. The cascode connected transistors NM43 and NM44 operate at an output stage, and hence a voltage is generated up to at least about a saturation drain voltage Vsat between a drain and a source of each of the transistors NM43 and NM44. The saturation drain voltage Vsat refers to a drain-source voltage corresponding to a transition boundary between a linear region and the saturation region of the MOS transistor. Even if a signal having a larger amplitude is input to the input transistors NM41 and NM42 so as to generate a voltage lower than the saturation drain voltage Vsat between the drain and the source of each of the transistors NM43 and NM44, when the source-drain voltage of each of the transistors NM43 and NM44 is further reduced, the transistors NM43 and NM44 operate in the linear region to decrease the current flowing through the transistors NM43 and NM44. As a consequence, the voltage drop amount from the power supply voltage VDD is decreased to increase the voltage generated at the drain of each of the transistors NM43 and NM44, and as a result, the voltage lower than the saturation drain voltage is not generated between the source and the drain of each of the transistors NM43 and NM44. In this case, the output terminals Vout+ and Vout− of the differential amplifier are connected to the transistors NM43 and NM44. Therefore, a minimum value of the voltage generated at each of the output terminals of the differential amplifier is VDD−Ic*RD−Vds−Vsat. This value and the power supply voltage VDD described above define an output range (allowable output operation range) of the differential amplifier.

Assume that the amplitude of each output signal has the maximum value of VDD and the minimum value of VDD−Ic*RD−Vds−Vsat when the input signal to the differential amplifier is amplified. Even if a signal larger in amplitude than the input signal is input to the terminals Vin+ and Vin− of the differential amplifier, the value of the output signal is neither increased above VDD nor reduced below VDD-Ic*RD-Vds-Vsat. That is, in this case, each of the signals output from the differential amplifier has a constant value. This is the limiter operation.

In the limiter operation described above, the loads $Z_1$ and $Z_2$ of the differential amplifier are resistors. However, a wireless communications system may handle a signal having a frequency as high as, for example, several MHz to 10 GHz. In such a case, it becomes difficult for the differential amplifier using the resistors as the loads $Z_1$ and $Z_2$ to perform the limiter operation on the signal having such high frequency. This is because each of the loads $Z_{out}$ connected to the output terminals Vout+ and Vout− of FIG. 11 has a capacitive impedance, and frequency characteristics on the high frequency side of the differential amplifier are decreased as the frequency of the signal handled by the differential amplifier is increased. Specifically, an amplification factor of the differential amplifier is decreased as the frequency of the signal handled by the differential amplifier is increased. This is because the capacitive impedance is decreased in proportion to a value of the frequency of the signal to be handled. As the frequency of the signal handled by the differential amplifier is increased, the impedance of the load $Z_{out}$ is decreased to increase current components that are not output from the output terminal Vout+ or Vout− and caused to flow through the load $Z_{out}$ and into the ground. As a result, a smaller current is allowed to flow to the side of the output terminal Vout+ or Vout−. As the current flowing into the terminal Vout+ or Vout− is decreased, the value of the voltage generated at the terminal Vout+ or Vout− is also decreased. Due to this phenomenon, the value of each of the signals output from the output terminals Vout+ and Vout− does not reach the above-mentioned maximum value and minimum value for the input signal having the high frequency. Then, the value of each of the signals output from the differential amplifier does not take the constant maximum value and minimum value for performing the limiter operation, and it becomes difficult to perform the limiter operation. Under such a situation, it is impossible to obtain the desired high gain and the limiter operation, and hence it becomes impossible to set the gain of the mixer 1005 constant.

It has also been conventionally known to use inductors as the loads $Z_1$ and $Z_2$ of the differential amplifier in order to obtain a good gain with respect to the high frequency signal. An inductor has a function of increasing the gain with respect to the high frequency signal in the differential amplifier. This is because of the characteristic that an impedance of the inductor increases in proportion to the frequency of the input signal. As a value of the impedance of the inductor increases, a voltage drop in each of the signals output from the output terminals Vout+ and Vout− of the differential amplifier of FIG. 11 becomes larger with respect to the power supply voltage VDD. In other words, each of the signals output from the terminals Vout+ and Vout− is increased in amplitude. In view of the frequency characteristics, compared with the case where the resistors are used as the loads of the differential amplifier, using the inductors as the loads of the differential amplifier makes it easier to enhance high frequency characteristics despite the effect of the capacitive impedance of the output load $Z_{out}$. In other words, compared to the case where the loads are the resistors, the inductors as the loads may maintain a high amplification factor even for the signal having the higher frequency. This is because, in view of the frequency characteristics of the amplification factor of the differential amplifier, while an estimated value of the frequency at which the amplification factor starts to decrease is about $1/(RC)$ in the case where the loads are the resistors, the estimated value of the frequency is about $1/(LC)$ (½) in the case where the loads are the inductors.

However, when the inductors are used as the loads $Z_1$ and $Z_2$ of the differential amplifier, it becomes difficult to make the differential amplifier perform the limiter operation. This is because when the inductors are used as the loads $Z_1$ and $Z_2$ of the differential amplifier, each of the signals output from the output terminals Vout+ and Vout− oscillates about the power supply voltage VDD. This is because in the case where the loads are the inductors, the inductors do not cause a voltage drop in a steady state. When the center of amplitude of each of the signals output from the differential amplifier reaches the power supply voltage VDD, the range (allowable output operation range) of the value of each of the signals output by the differential amplifier is increased. This is described with reference to FIG. 14. As in FIG. 13, the constant current source having the resistance RD generates the potential Ic*RD with respect to the GND reference (0 V). The input transistors NM41 and NM42 operate in the saturation region and consume the source-drain voltage Vds of a predetermined value. The cascode connected transistors NM43 and NM44 operate at an output stage, and hence a voltage is generated up to at least about the saturation drain voltage Vsat between the source and the drain of the transistors NM43 and NM44 as described above. In this case, where the loads of the differential amplifier are the inductors, there is no maximum value for voltage values above the power supply voltage VDD, which is the center of oscillation. However, there is a minimum value of VDD-Ic*RD-Vds-Vsat for voltage values below the power supply voltage VDD. Therefore, this minimum value restricts the maximum value of each of the signals. When an absolute value is represented by the symbol ||, the maximum value is VDD+|VDD-Ic*RD-Vds-Vsat|. Consequently, the range (allowable output operation range) of the value of each of the signals output by the differential amplifier is 2×(VDD-Ic*RD-Vds-Vod). As can be seen, when the inductors are used as the loads, twice the output amplitude in the case where the resistors are used as the loads is obtained. However, it is required for the differential amplifier to amplify the input signal with a correspondingly higher amplification factor, and it becomes difficult to perform the limiter operation.

As described above, according to the conventional technology, the attempt to make the amplitude of each of the signals output by the differential amplifier constant fails to appropriately make the amplitude constant for the input signal having the high frequency because a gain drop occurs, and the attempt to increase the decreasing gain makes it difficult to realize the limiter operation of the differential amplifier that makes the amplitude constant. Consequently, the conventional technology has had a technical problem to be solved in that it is difficult for the differential amplifier that amplifies the signal having the high frequency to make the amplitude of each output signal constant.

SUMMARY

A differential amplifier according to the present invention includes: a first signal path extending from a power supply line to a ground line; a first MOS transistor for causing a signal flowing through the first signal path to flow between a source and a drain thereof and receiving a first input signal at a gate thereof, the first input signal being amplified by the differential amplifier; a second MOS transistor for operating to decrease the signal flowing through the first signal path and passing through a source and a drain thereof when the first MOS transistor operates to increase an amount of the signal flowing through the first signal path and passing through the source and the drain of the first MOS transistor; and a third MOS transistor for operating to increase the signal flowing through the first signal path and passing through a source and a drain thereof when the first MOS transistor operates to increase the amount of the signal flowing through the first signal path and passing through the source and the drain of the first MOS transistor.

According to the present invention, when the first MOS transistor operates to increase the amount of the signal flowing through the source and the drain thereof, the second MOS transistor operates to decrease the amount of the signal. This produces an effect of increasing a minimum value of the signal output by the differential amplifier. This is because the second MOS transistor has a function of confining the maximum current originally caused to flow by the first MOS transistor. Further, when the first MOS transistor operates to increase the amount of the signal flowing between the source and the drain thereof, the third MOS transistor operates to increase the amount of the signal. This ensures a small signal gain comparable to or better than the conventional differential amplifier in the high frequency region. Therefore, the minimum value of the output signal is increased while maintaining the small signal gain in the high frequency region, to thereby realize the limiter operation even in the high frequency region.

The present invention enables the differential amplifier to perform the limiter operation also on the signal having the high frequency, and hence to perform the limiter operation even when the differential amplifier amplifies a signal having a wide frequency range, that is, a wide band signal. Further, according to the present invention, the following two effects may be obtained: the differential amplifier may have a good frequency characteristic in a wide band; and the gain of the differential amplifier is enhanced.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments for carrying out the present invention are described below using specific examples. However, the described embodiments are mere examples, and the scope of the present invention should not be limited to the scope of the embodiments.

First Embodiment

Figure 1:
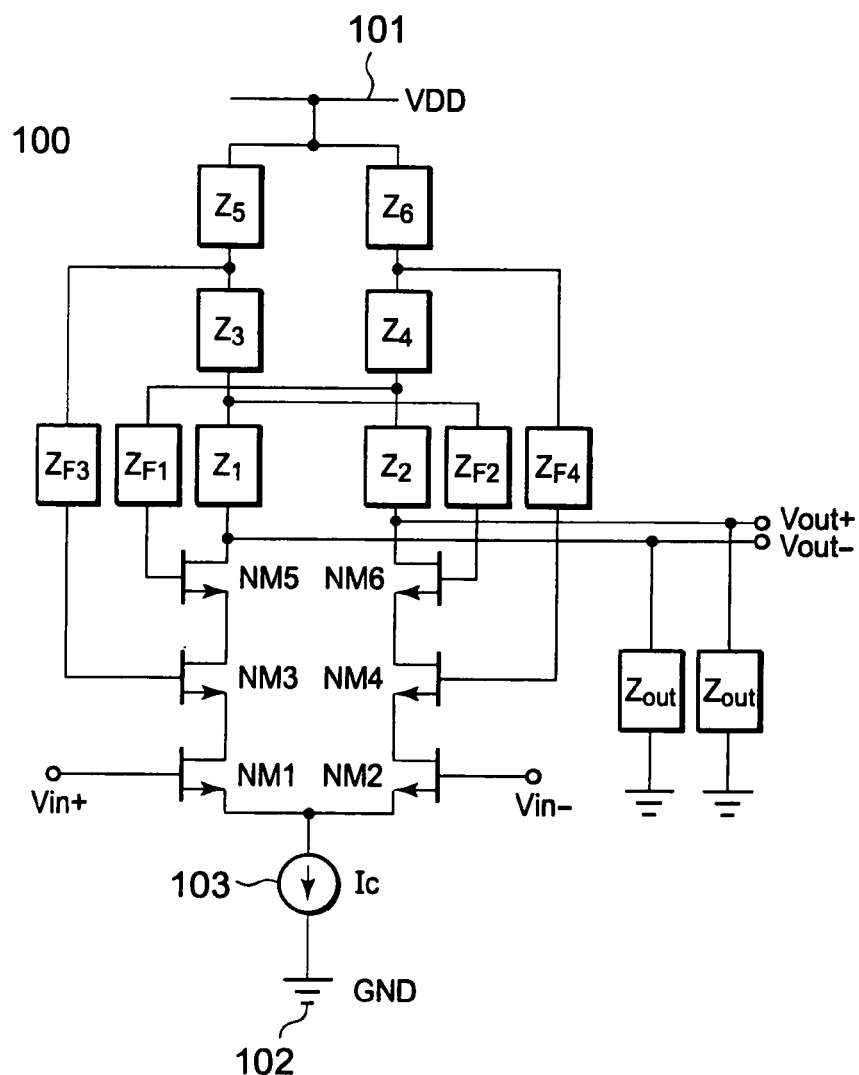
FIG. 1 illustrates a general configuration of a differential amplifier according to a first embodiment of the present invention.

FIG. 1 illustrates a differential amplifier 100 according to a first embodiment of the present invention. First, a configuration of the differential amplifier 100 is described. Circuit elements constituting the differential amplifier 100 are provided between a power supply line 101, which supplies a power supply voltage VDD, and a ground line 102, which defines a reference potential. A constant current source 103 is a current source that supplies a current of a constant current value Ic. Transistors NM1, NM2, NM3, NM4, NM5, and NM6 are n-type MOS transistors, and each has a gate for controlling a channel formed between a source and a drain to be ON and OFF. The source of the MOS transistor NM1 and the source of the MOS transistor NM2 are connected to the constant current source 103. The gate of the MOS transistor NM1 is connected to an input terminal Vin+. A first input signal to be amplified is input to the input terminal Vin+. On the other hand, the gate of the MOS transistor NM2 is connected to an input terminal Vin−. A second input signal to be amplified is input to the input terminal Vin−.

The second input signal has a phase different from the first input signal. In this case, for describing a better operation, the first input signal and the second input signal are differential signals having phases different from each other by 180°.

The drain of the MOS transistor NM1 is connected in series with the source of the MOS transistor NM3. Similarly, the drain of the MOS transistor NM2 is connected in series with the source of the MOS transistor NM4. A voltage signal as a so-called negative feedback signal is input to the gate of the MOS transistor NM3 through a load impedance $Z_5$ and a feedback path impedance $Z_{F3}$ of the differential amplifier. Note that in this case, with respect to the phase of the first input signal, which is input to the input terminal Vin+, the negative feedback signal refers to a signal having an opposite phase (a phase different by 180°) with respect to the first input signal. In response to the negative feedback signal, the MOS transistor NM3 performs an operation for controlling an amount of a current flowing between the drain and the source thereof based on a feedback signal amount (value of voltage applied to the gate of the MOS transistor NM3) determined by a ratio between load impedances $Z_1$, $Z_3$, and $Z_5$ and the feedback path impedance $Z_{F3}$. Similarly, a voltage signal as a so-called negative feedback signal is input to the gate of the MOS transistor NM4 through a load impedance $Z_6$ and a feedback path impedance $Z_{F4}$ of the differential amplifier. In this case, with respect to the phase of the second input signal, which is input to the input terminal Vin–, the negative feedback signal refers to a signal having an opposite phase to the second input signal. In response to the negative feedback signal, the MOS transistor NM4 performs an operation for controlling an amount of a current flowing between the drain and the source thereof based on a feedback signal amount (value of voltage applied to the gate of the MOS transistor NM4) determined by a ratio between load impedances $Z_2$, $Z_4$, and $Z_6$ and the feedback path impedance $Z_{F4}$.

The source of the MOS transistor NM5 and the drain of the MOS transistor NM3 are connected in series. A voltage signal as a so-called positive feedback signal is input to the gate of the MOS transistor NM5 through the load impedances $Z_4$ and $Z_6$ and a feedback path impedance $Z_{F1}$ of the differential amplifier. Note that in this case, with respect to the phase of the first input signal, which is input to the input terminal Vin+, the positive feedback signal refers to a signal having the same phase as the first input signal. In response to the positive feedback signal, the MOS transistor NM5 controls an amount of a current flowing between the source and the drain thereof based on a feedback signal amount (value of voltage applied to the gate of the MOS transistor NM5) determined by a ratio between the load impedances $Z_2$, $Z_4$, and $Z_6$ and the feedback path impedance $Z_{F1}$. The source of the MOS transistor NM6 and the drain of the MOS transistor NM4 are connected in series. A voltage signal as a so-called positive feedback signal is input to the gate of the MOS transistor NM6 through the load impedances $Z_3$ and $Z_5$ and a feedback path impedance $Z_{F2}$ of the differential amplifier. Note that in this case, with respect to the phase of the second input signal, which is input to the input terminal Vin–, the positive feedback signal refers to a signal having the same phase as the second input signal. In response to the positive feedback signal, the MOS transistor NM6 controls a current flowing between the source and the drain thereof based on a feedback signal amount (value of voltage applied to the gate of the MOS transistor NM6) determined by a ratio between the load impedances $Z_1$, $Z_3$, and $Z_5$ and the feedback path impedance $Z_{F2}$.

The drain of the MOS transistor NM5 is connected to a first node between the drain and the load $Z_1$, and the first node is connected to an output terminal Vout–. The output terminal Vout– outputs a signal obtained by amplifying the first input signal, which is input to the gate of the MOS transistor NM1. Similarly, the drain of the MOS transistor NM6 is connected to a second node between the drain and the load $Z_2$, and the second node is connected to an output terminal Vout+. The output terminal Vout+ outputs a signal obtained by amplifying the second input signal, which is input to the gate of the MOS transistor NM2. The output signals are described below in detail.

Hereinabove, each of the MOS transistors used in the differential amplifier according to the first embodiment of the present invention has been described. In this embodiment, the MOS transistors NM1, NM2, NM5, and NM6 operate in a saturation region, and the MOS transistors NM3 and NM4 operate in a linear region.

Each load $Z_{out}$ connected to each of the output terminals Vout+ and Vout– is a load having a capacitive impedance. The load $Z_{out}$ includes, for example, a wiring capacitance of a wiring connecting each of the output terminals Vout+ and Vout– to each of the first node and the second node, and impedance components at inputs of a signal wiring and a circuit block in a subsequent stage connected to each of the output terminals Vout+ and Vout–.

Figure 2:
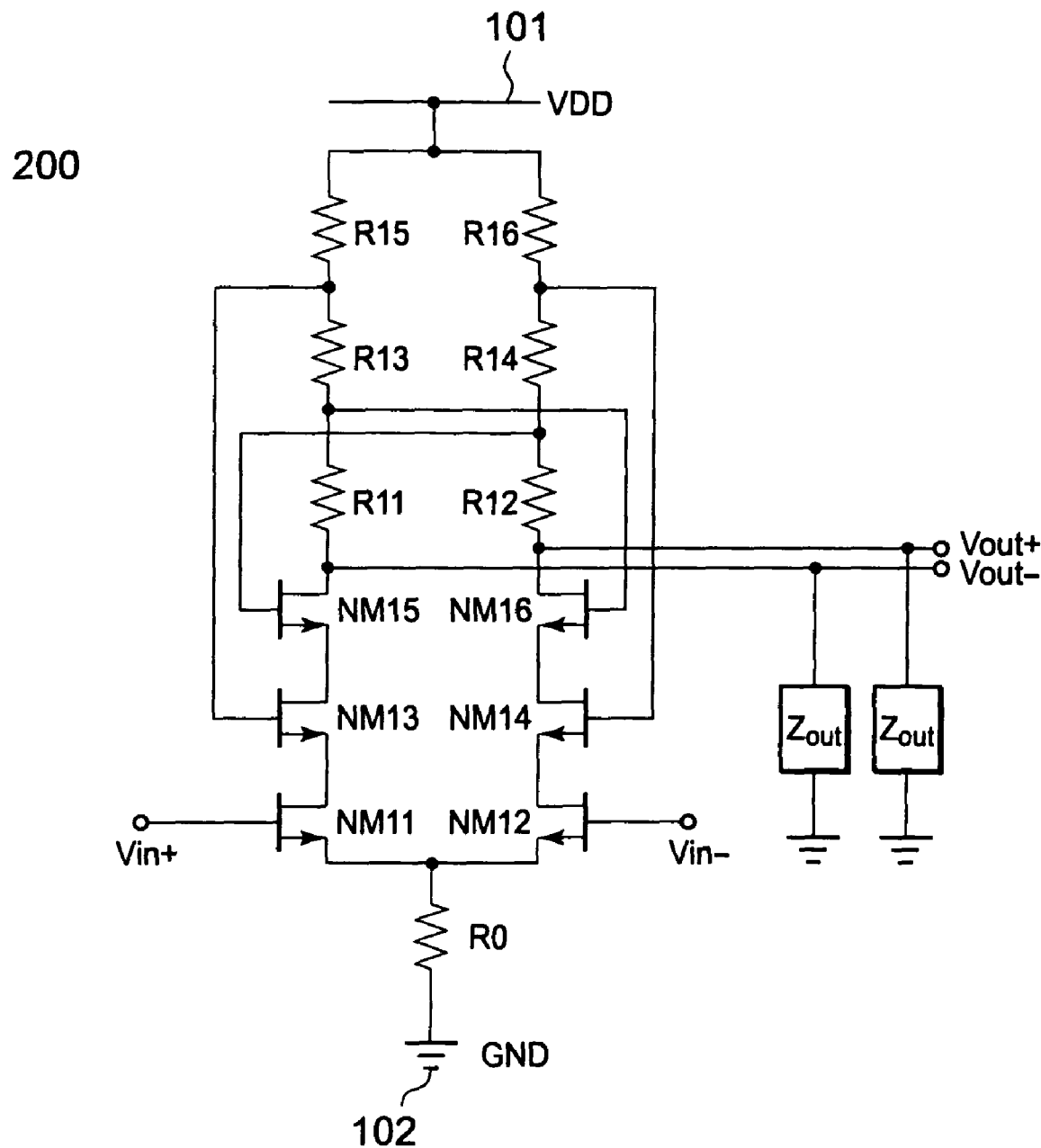
FIG. 2 illustrates a specific configuration example of the differential amplifier according to the first embodiment of the present invention.

In this case, the differential amplifier 100 includes the loads $Z_1$ to $Z_6$ and $Z_{F1}$ to $Z_{F4}$. As an example, the loads $Z_1$, $Z_3$, and $Z_5$ may be collectively referred to as a first load circuit, and the loads $Z_2$, $Z_4$, and $Z_6$ may be collectively referred to as a second load circuit. The loads $Z_1$ to $Z_6$ and $Z_{F1}$ to $Z_{F4}$ are determined based on the application and purpose of a system in which the differential amplifier 100 is used, and for description of the first embodiment, each of the loads is determined as in a differential amplifier 200 illustrated in FIG. 2. In FIG. 2, all circuit elements constituting the first load circuit (circuit including the loads $Z_1$, $Z_3$, and $Z_5$) are resistors. Specifically, the load $Z_1$ is a resistor R11, the load $Z_3$ is a resistor R13, and the load $Z_5$ is a resistor R15. Similarly, all circuit elements constituting the second load circuit (circuit including the loads $Z_2$, $Z_4$, and $Z_6$) are resistors. Specifically, the load $Z_2$ is a resistor R12, the load $Z_4$ is a resistor R14, and the load $Z_6$ is a resistor R16. On the other hand, all the loads $Z_{F1}$ to $Z_{F4}$ are short circuits. Note that the constant current source 103 is replaced by a resistor RD. Other configuration illustrated in FIG. 2 is the same as the circuit illustrated in FIG. 1. Among other components, a MOS transistor NM11 is the same as the MOS transistor NM1 of FIG. 1. Similarly, MOS transistors NM12, NM13, NM14, NM15, and NM16 are the same as the MOS transistors NM2, NM3, NM4, NM5, and NM6, respectively.

Next, an operation of the differential amplifier 200, which is a specific example of the differential amplifier 100, is described. For ease of understanding, the operation is described using the differential amplifier 200 that uses the resistors as the loads. However, the present invention exemplified by this embodiment does not depend on the type of the loads, and may be generalized as, for example, the differential amplifier 100 of FIG. 1.

Figure 3A:
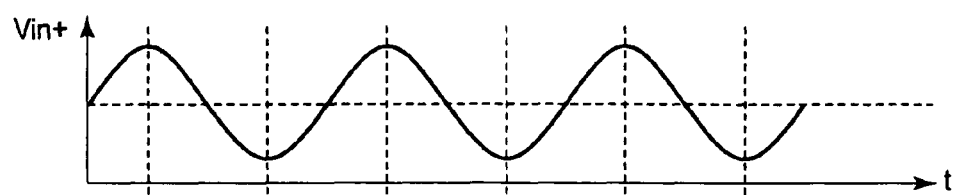
FIGS. 3A to 3C are graphs illustrating a phase relationship among various signals involved in the differential amplifier according to the first embodiment of the present invention.

Referring to FIGS. 2, 3A to 3C, and 15, the operation of the differential amplifier 200 is described. FIG. 3A illustrates a first input signal, which is input to a gate of the MOS transistor NM11 from an input terminal Vin+ of the differential amplifier 200. A value of the signal oscillates at a constant frequency, and a current flowing between a source and a drain of the MOS transistor NM11 changes in accordance with the value of the signal. On the other hand, a second input signal (not shown), which is input to a gate of the MOS transistor NM12 from another input terminal Vin–, is a signal having a phase different from the signal illustrated in FIG. 3A by 180°.

In this case, a voltage signal, which is phase-shifted from the signal input to the gate of the MOS transistor NM11 from the terminal Vin+ (FIG. 3A) by 180°, is supplied to a node between the resistors R15 and R13, a node between the resistors R13 and R11, and a node between the resistor R11 and the MOS transistor NM15 of the differential amplifier 200 of FIG. 2. This is due to an operation in which, as described above, as an amplitude of the signal from the terminal Vin+ becomes larger and hence a value of the current flowing between the source and the drain of the MOS transistor NM11 becomes larger, a voltage drop amount across the resistors R15, R13, and R11 becomes larger to decrease a value of a voltage generated at each node, and as the amplitude of the signal from the terminal Vin+ becomes smaller and hence the value of the current flowing between the source and the drain of the MOS transistor NM11 becomes smaller, the voltage drop amount across the resistors R15, R13, and R11 becomes smaller to increase the value of the voltage generated at each node. In other words, the voltage signal supplied to each of the node between the resistors R15 and R13, the node between the resistors R13 and R11, and the node between the resistor R11 and the MOS transistor NM15 has the same phase as the second input signal, which is input from the terminal Vin−.

Similarly, a voltage signal, which is phase-shifted from the signal input to the gate of the MOS transistor NM12 from the terminal Vin− by 180°, is supplied to a node between the resistors R16 and R14, a node between the resistors R14 and R12, and a node between the resistor R12 and the MOS transistor NM16.

This is due to an operation in which, as described above in the section describing the basic operation of the differential amplifier, as an amplitude of the signal from the terminal Vin− becomes larger and hence a value of a current flowing between a source and a drain of the MOS transistor NM12 becomes larger, a voltage drop amount across the resistors R16, R14, and R12 becomes larger to decrease a value of a voltage generated at each node, and as the amplitude of the signal from the terminal Vin− becomes smaller and hence the value of the current flowing between the source and the drain of the MOS transistor NM12 becomes smaller, the voltage drop amount across the resistors R16, R14, and R12 becomes smaller to increase the value of the voltage generated at each node. In other words, the voltage signal supplied to each of the node between the resistors R16 and R14, the node between the resistors R14 and R12, and the node between the resistor R12 and the MOS transistor NM16 has the same phase as the first input signal, which is input from the terminal Vin+.

Figure 3B:
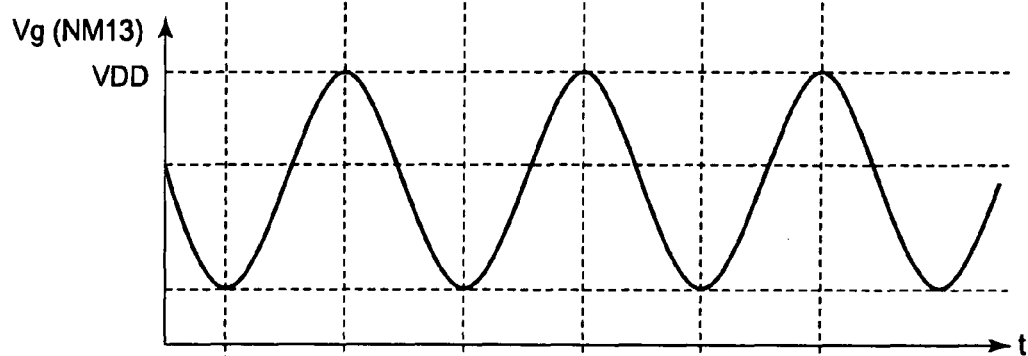
Figure 3C:
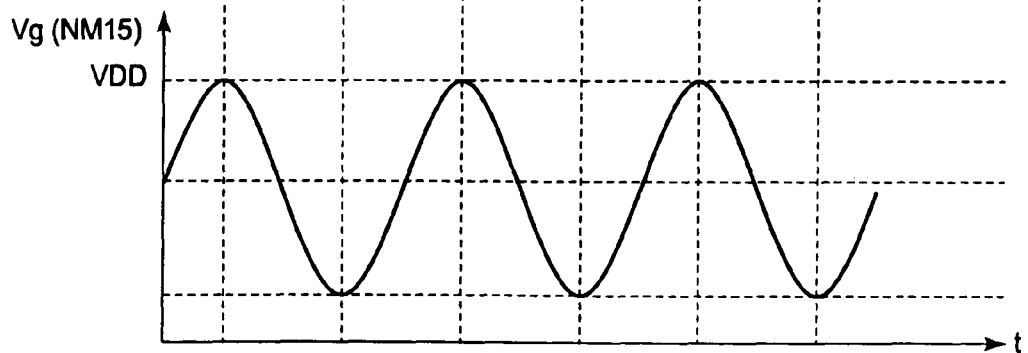

In view of the above, reference is made to FIG. 3B. FIG. 3B illustrates a waveform of a signal, which is input to a gate of the NMOS transistor NM13 included in the differential amplifier 200 of FIG. 2, and also illustrates a phase relationship with the first input signal, which is input from the terminal Vin+. As can be seen from FIG. 3B, the first input signal and the signal input to the gate of the MOS transistor NM13 are phase-shifted from each other by 180°. Accordingly, when the NMOS transistor NM11 operates to increase a current flowing through the MOS transistors NM15, NM13, and NM11 in response to an increase in value of the first input signal, the NMOS transistor NM13 operates to decrease the current flowing through the MOS transistors NM15, NM13, and NM11. Then, an overall resistance value of the MOS transistors NM11, NM13, and NM15 is increased compared to a case where the MOS transistor NM13 does not perform the above-mentioned operation. In this case, the voltage generated at the node connected to the output terminal Vout− in accordance with the first input signal, which is input from the terminal Vin+, is increased. This is because as the resistance value becomes larger, a value of the voltage allocated to the resistance value is also increased. When the value of the first input signal, which is input from the terminal Vin+, is at a maximum value, the transistor NM11 operates to maximize the current flowing through the transistors NM15, NM13, and NM11. However, at this time, a value of the signal input to the gate of the transistor NM13 is at a minimum, and the transistor NM13 operates to minimize the current flowing through the transistors NM15, NM13, and NM11. In other words, the transistor NM13 operates to confine a maximum value of the current caused to flow by the transistor NM11 to a smaller value. With the transistors NM15, NM13, and NM11 being connected in series, a maximum value of the current flowing between the source and the drain of each of the transistors is smaller than the maximum value of the current originally caused to flow by the transistor NM11 based on the operation of the transistor NM13. Then, a minimum value of the voltage generated at the node between the resistor R11 and the transistor NM15, to which the output terminal Vout− is connected, is increased compared to the case where the transistor NM13 does not perform the above-mentioned operation. This increase in voltage means increasing a minimum value of an output voltage for realizing the limiter operation of the differential amplifier.

Figure 15:
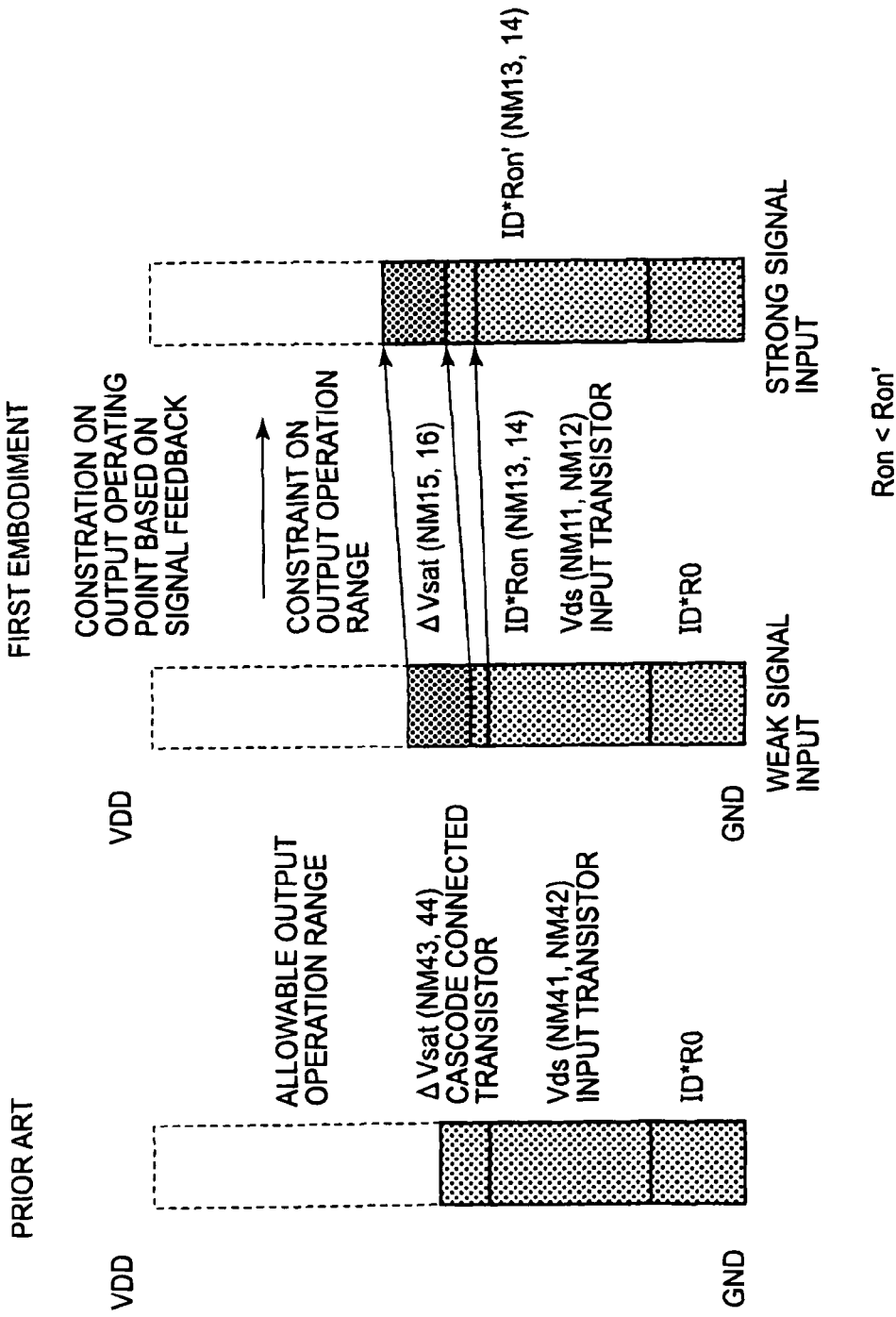
FIG. 15 is a diagram comparing voltages generated in MOS transistors in the conventional example and MOS transistors in the first embodiment of the present invention.

FIG. 15 illustrates the operations described above. By dynamically shifting an operation region of the transistor NM13 based on a negative feedback signal input to the gate of the transistor NM13 to increase a lower limit of an output operation range and constrain the output range, the limiter operation of the differential amplifier may be facilitated. Hereinabove, the first embodiment of the present invention has been described specifically for the NMOS transistors NM11 and NM13, but the NMOS transistors NM12 and NM14 perform similar operations in an inverted phase as a part of the differential amplifier.

Another way to facilitate the limiter operation is to increase a gain of the differential amplifier. This is because when the differential amplifier has a high gain even for a high frequency signal, the signal output as a result of amplifying the input signal by the differential amplifier has a large amplitude. As described above, in order to make the value of the amplitude of the signal output by the differential amplifier constant using the limiter operation, it is necessary for the differential amplifier to amplify the input signal so that the amplitude thereof reaches at least the maximum value or minimum value required for realizing the limiter operation.

The NMOS transistors NM15 and NM16 included in the differential amplifier 200 of FIG. 2 are provided to increase the gain of the differential amplifier 200 and further to enhance high frequency characteristics. In this embodiment, by further providing the transistors NM15 and NM16 as in FIG. 2, a small signal gain comparable to or better than the differential amplifier according to the conventional technology may be maintained up to a higher frequency.

The small signal gain Ga of the differential amplifier 200 is proportional to a transconductance (gm) product of the MOS transistors located between the ground line 102 and each of the nodes to which the output terminals Vout+ and Vout− are connected (Specifically, $Ga \propto gm11(gm12 \cdot ro11 \cdot ro12//Z_1)$). Therefore, providing the transistors NM15 and NM16 leads to an increase in gain of the differential amplifier 200 compared to a case where the transistors NM15 and NM16 are not provided.

Further, each of the transistors NM15 and NM16 is configured to be supplied a DC bias and a positive feedback signal to a gate thereof from the loads of the differential amplifier. Therefore, the frequency characteristics of the gain may be adjusted by adjusting a feedback (impedance) amount of the positive feedback signal input to the gates of the MOS transistors NM15 and NM16. Specifically, according to this embodiment, a peaking effect may be obtained with respect to the gain, and the small signal gain may be enhanced in a high frequency band.

The differential amplifier according to this embodiment, in which the transistors NM13 and NM15 are connected in series with the transistor NM11 and the transistors NM14 and NM16 are connected in series with the transistor NM12, may operate with a power supply voltage VDD equivalent to the conventional example. This is described, for example, for the transistors NM11, NM13, and NM15, which are connected in series, as examples. Those transistors are vertically stacked in a cascode connection, and hence a different voltage is applied to the gate of each of the transistors. Specifically, the voltage applied to the gate of the transistor NM13 is higher than the voltage applied to the gate of the transistor NM15. With such circuit design, when the voltage at the gate of a MOS transistor is determined, the voltage between the source and the drain thereof is also determined accordingly. In this embodiment, the circuit is designed to force the transistor NM13 to operate in a linear region. When the transistors NM13 and NM14 operate in the linear region, the voltage between the source and the drain thereof becomes close to 0 V, and hence the transistor NM13 may be regarded as being equivalent to a resistor (ON resistance). The voltage applied between the source and the drain of each of the transistors NM13 and NM14 is significantly reduced compared to a case where the transistors NM13 and NM14 are operated in a saturation region, and hence it is possible to vertically stack the MOS transistors used in the differential amplifier in the cascode connection as illustrated in FIG. 2. On the other hand, the other MOS transistors are operated in the saturation region.

Figure 4A:
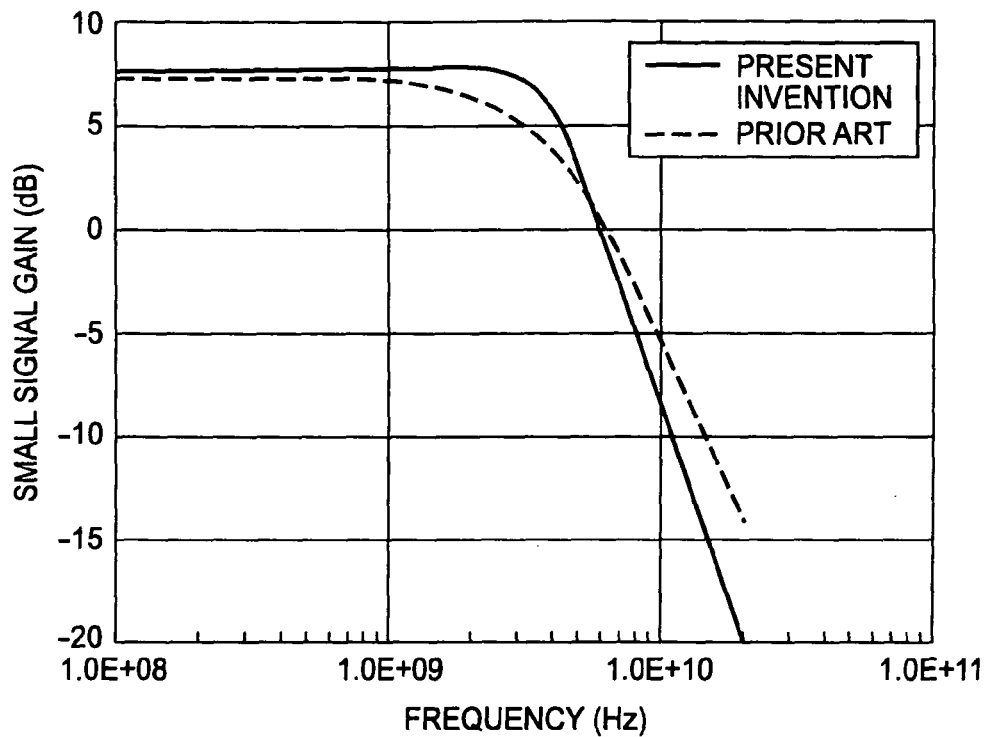
FIGS. 4A and 4B illustrate a frequency characteristic of a gain of the differential amplifier according to the first embodiment of the present invention.
Figure 4B:
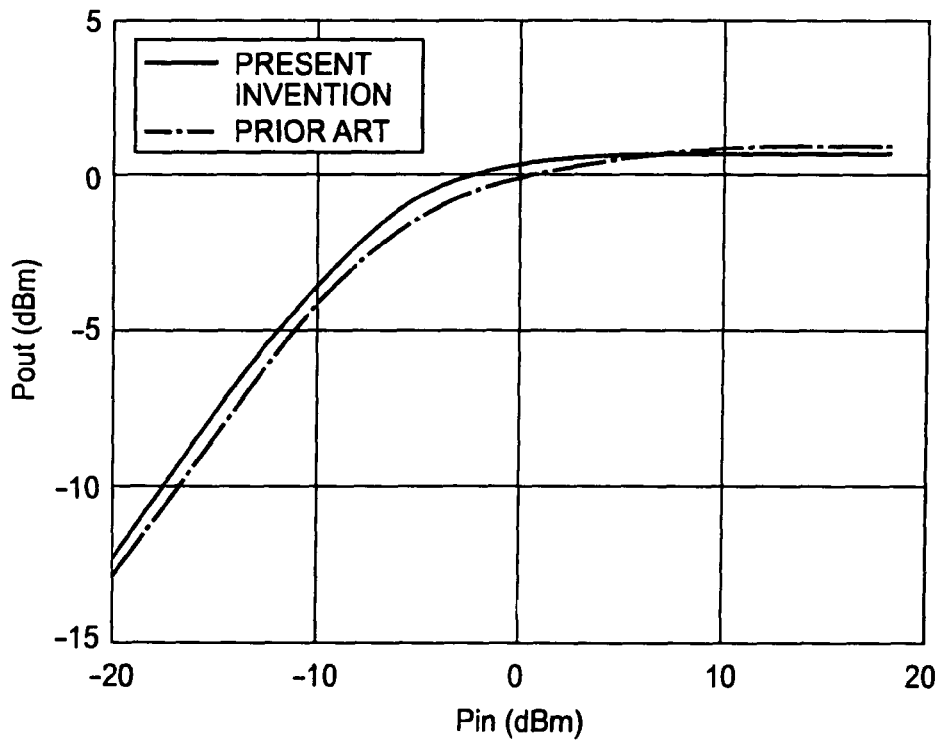
Figure 11:
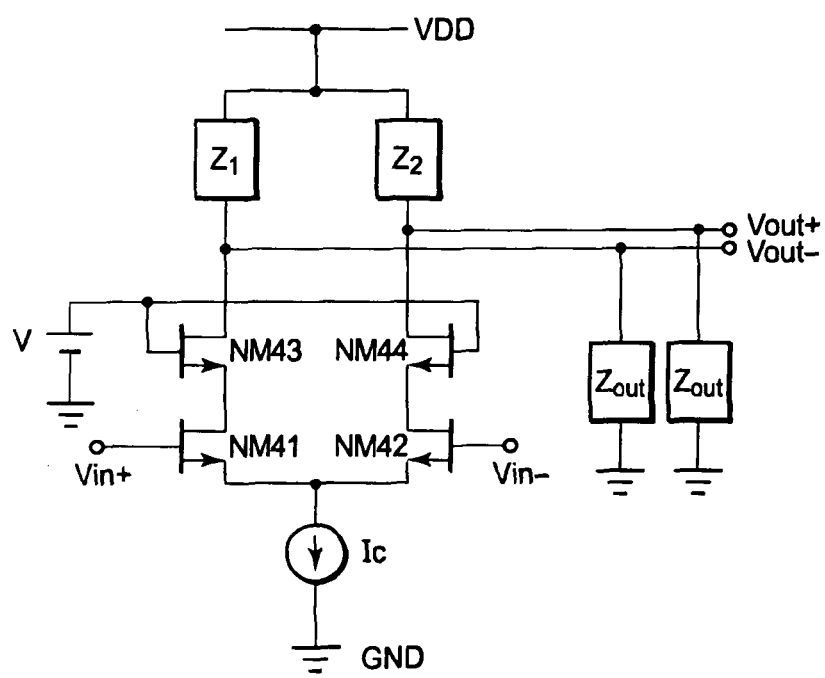
FIG. 11 illustrates a configuration of a differential amplifier used in the conventional technology.
Figure 12A:
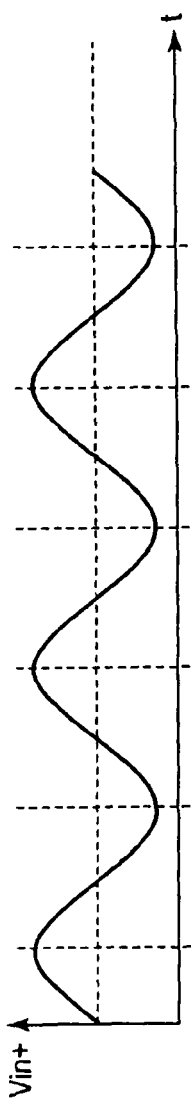
FIGS. 12A to 12C are graphs illustrating a principle of the differential amplifier.
Figure 12B:
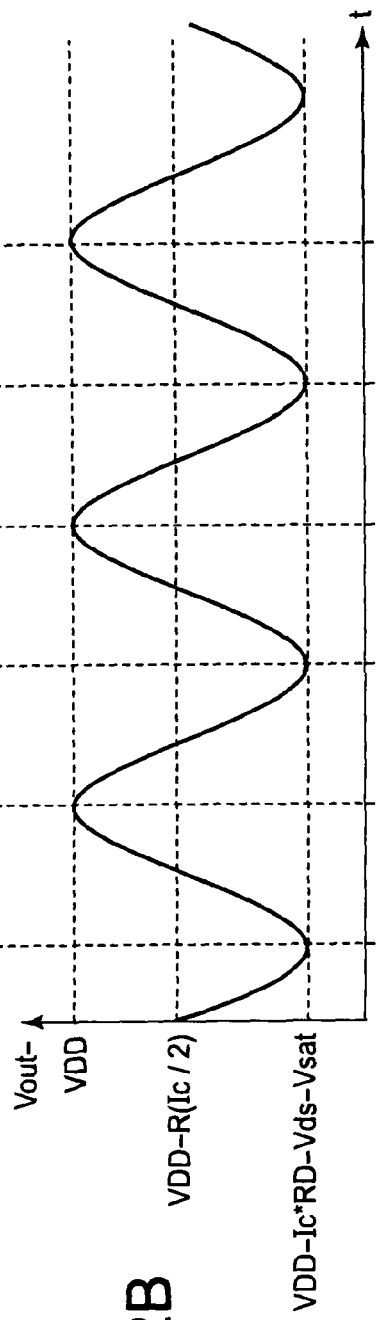
Figure 12C:
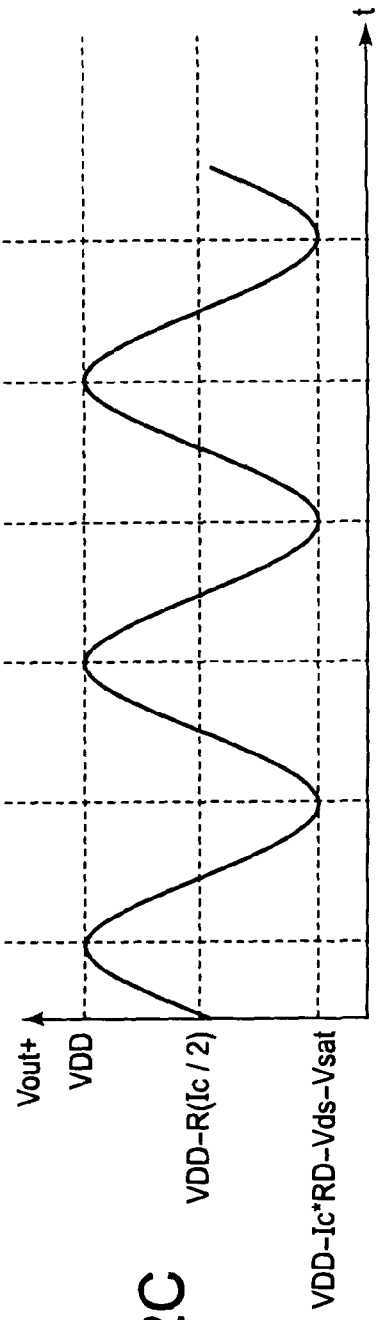
Figure 13:
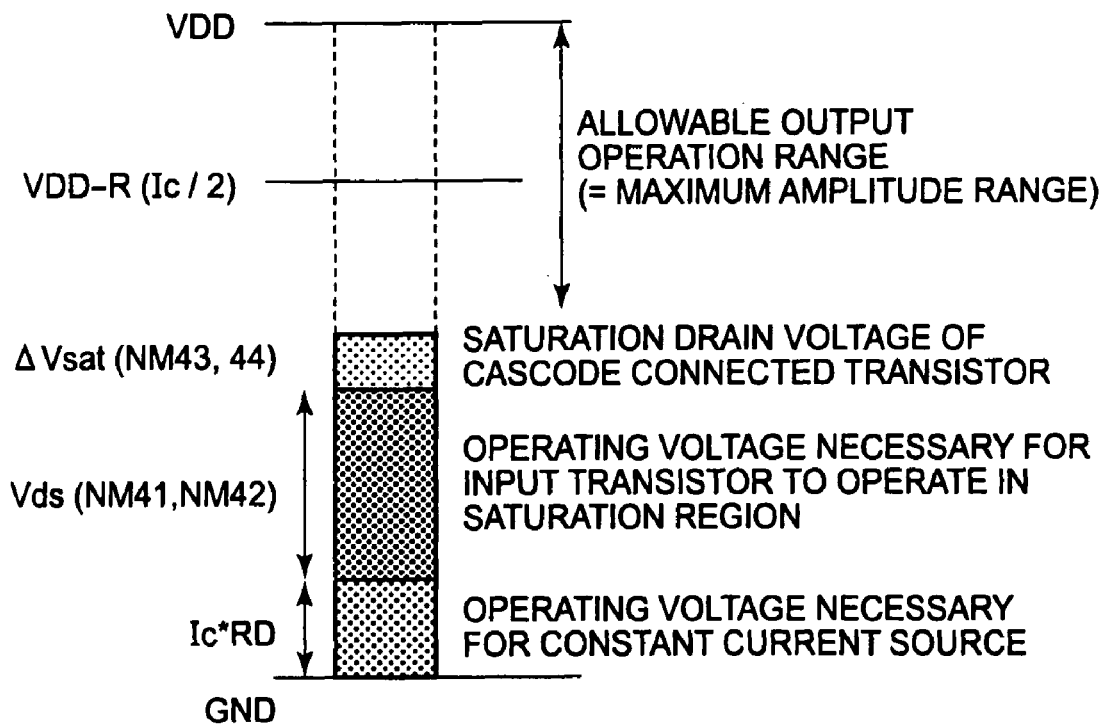
FIG. 13 is a diagram illustrating voltages generated in MOS transistors in a conventional example.
Figure 14:
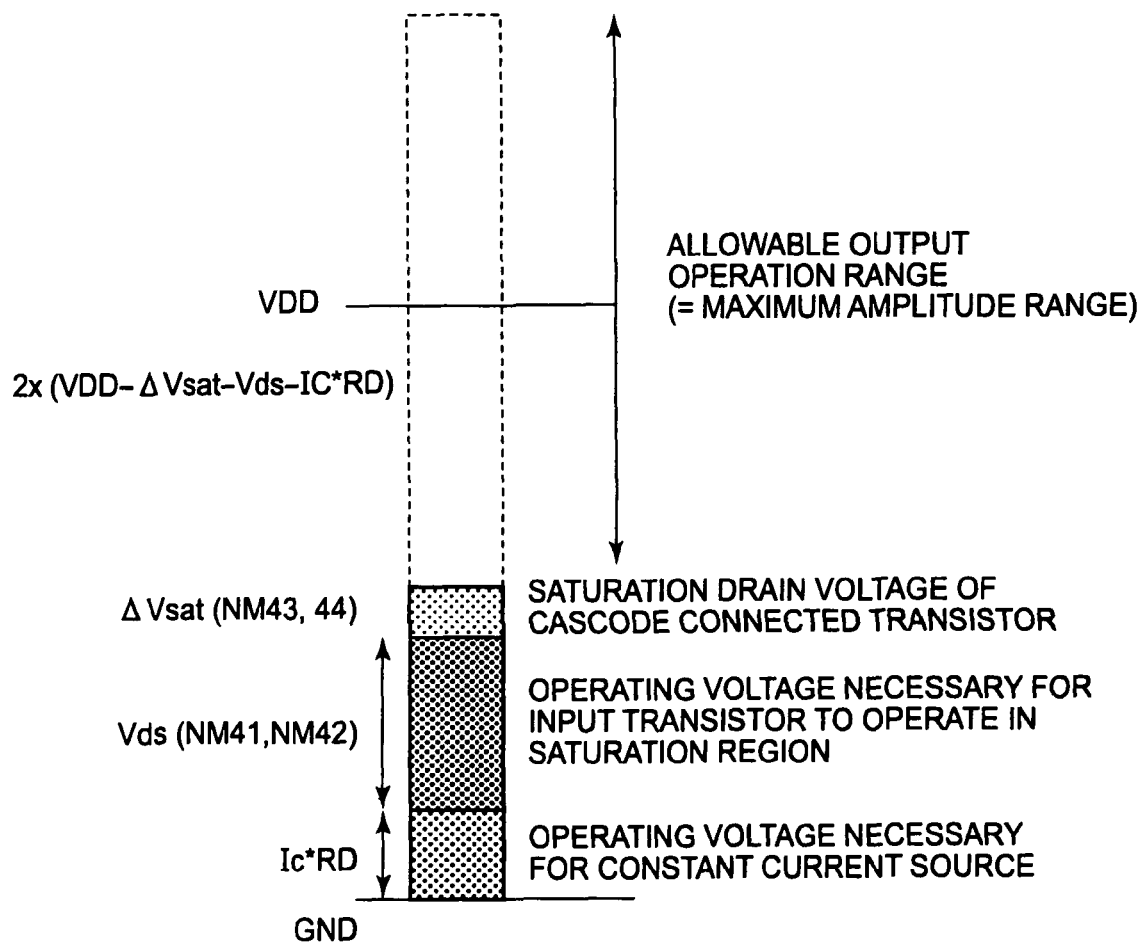
FIG. 14 is a diagram illustrating voltages generated in the MOS transistors in another conventional example.

FIG. 4A and FIG. 4B illustrate comparison results between characteristics of the conventional differential amplifier illustrated in FIG. 11 and the differential amplifier 200 according to this embodiment illustrated in FIG. 2. The power supply voltage VDD and the current Ic are identical between the conventional differential amplifier and the differential amplifier according to this embodiment. Further, the loads $Z_1$ and $Z_2$ in the differential amplifier of FIG. 11 are resistors. In FIG. 4A, the abscissa represents the frequency and the ordinate represents the small signal gain.

FIG. 4B illustrates a relationship between a power of the input signal and a power of the output signal of the differential amplifiers. The abscissa represents an input amplitude, the ordinate represents an output amplitude, and the frequency is 2 GHz. As can be seen from FIG. 4A and FIG. 4B, compared to the conventional differential amplifier, the differential amplifier 200 according to this embodiment may maintain a high gain up to a higher frequency and has a larger power range of the input signal in which the power of the output signal is constant. This means that, compared to the conventional differential amplifier, the differential amplifier 200 according to this embodiment has better frequency characteristics and may realize the limiter operation on the input signal having a smaller amplitude.

Second Embodiment

Figure 5:
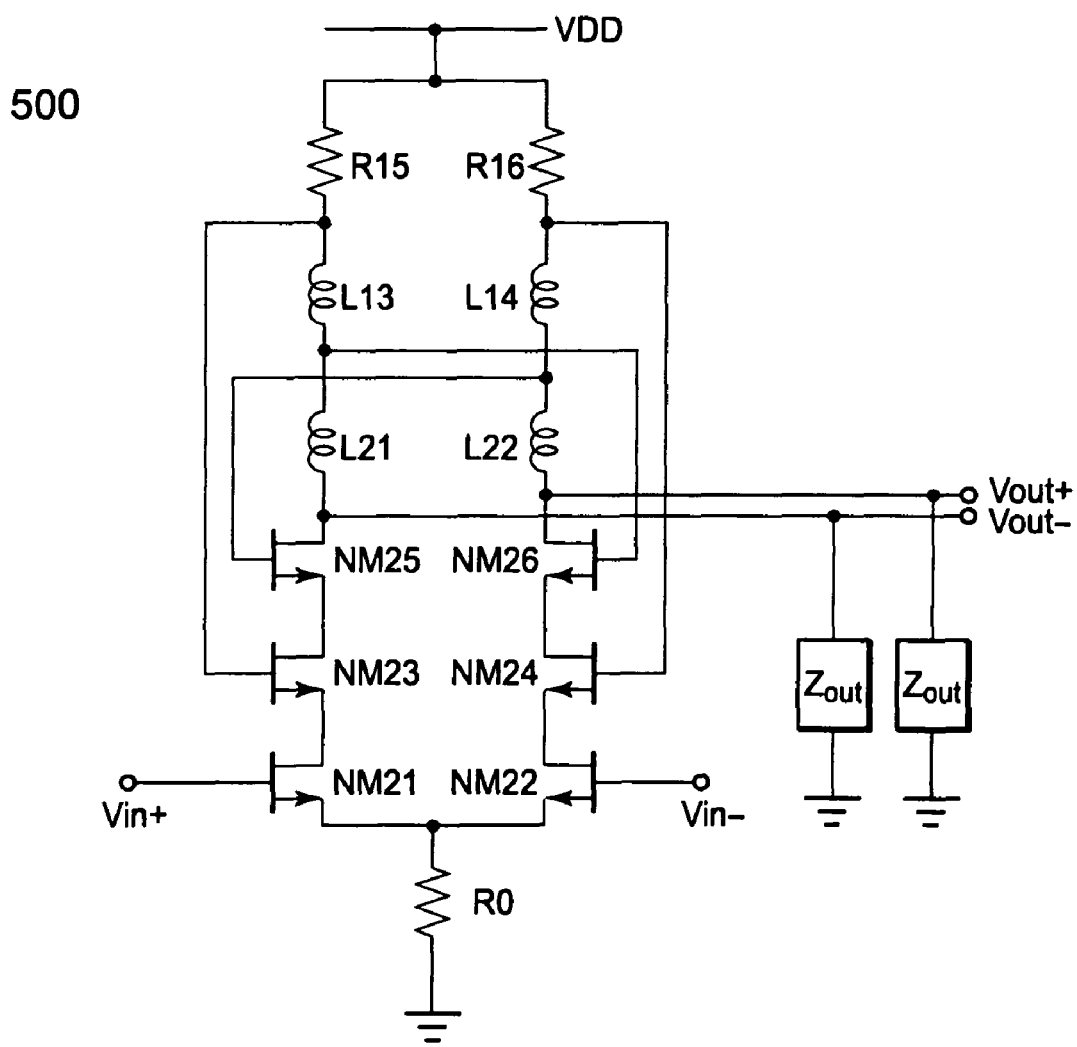
FIG. 5 illustrates a specific configuration example of a differential amplifier according to a second embodiment of the present invention.

FIG. 5 illustrates a differential amplifier 500 according to a second embodiment of the present invention. The differential amplifier 500 according to the second embodiment is different from the differential amplifier 200 according to the first embodiment in that each of the first load circuit and the second load circuit includes inductors as well as a resistor. Specifically, the loads $Z_1$ and $Z_3$ in the first load circuit are the inductors, and the loads $Z_2$ and $Z_4$ in the second load circuit are the inductors.

By using the inductors in the first load circuit and the second load circuit, the differential amplifier 500 may achieve a high gain in a higher frequency region than the differential amplifier 200 according to the first embodiment. NMOS transistors NM23 and NM24 operate in a linear region as in the first embodiment, and have a function of suppressing a current caused to flow by NMOS transistors NM21 and NM22 and hence increasing a lower limit of a limiter operation dynamically. NMOS transistors NM25 and NM26 have a function of enhancing a gain of the differential amplifier in response to a positive feedback signal as in the first embodiment. In other words, the differential amplifier 500 according to the second embodiment of the present invention achieves an enhanced gain in a high frequency band with the use of the inductors and the positive feedback signal to gates of the NMOS transistors NM25 and NM26, and also facilitates the limiter operation based on a negative feedback signal to gates of the NMOS transistors NM23 and NM24 operating in the linear region, to thereby realize enhancement in high frequency characteristics.

Figure 6:
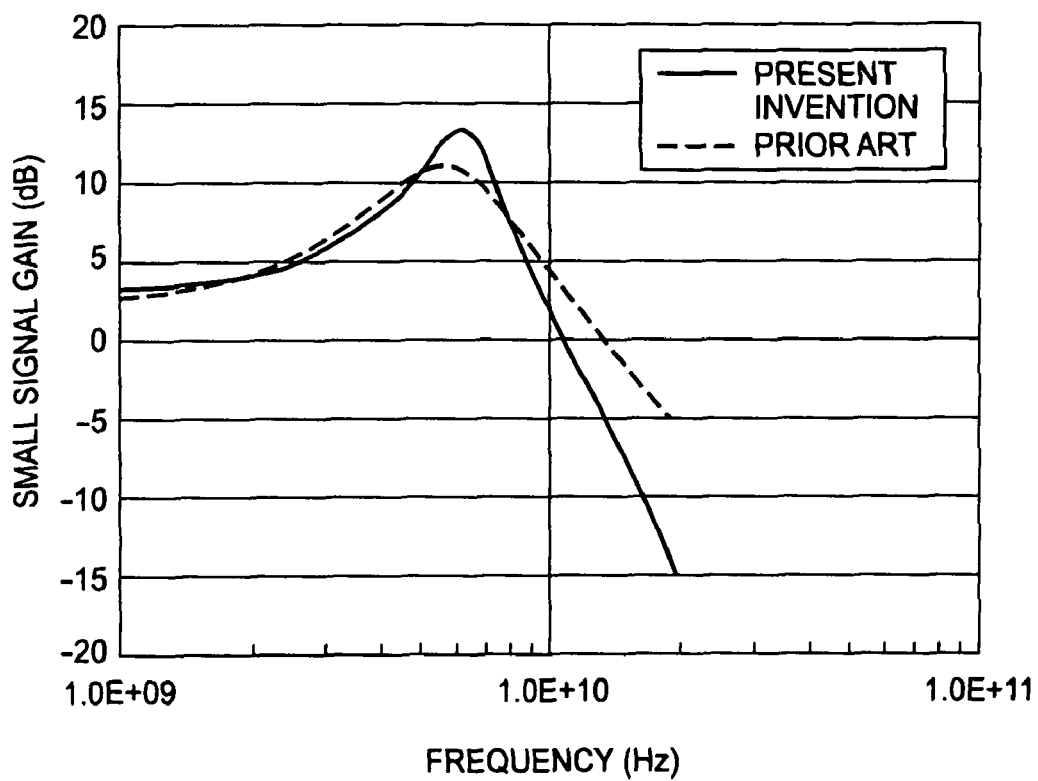
FIG. 6 illustrates a frequency characteristic of a gain of the differential amplifier according to the second embodiment of the present invention.

FIG. 6 illustrates a comparison result between characteristics of the conventional differential amplifier illustrated in FIG. 11 and the differential amplifier 500 according to this embodiment illustrated in FIG. 5. The power supply voltage VDD and the current Ic are identical between the conventional differential amplifier and the differential amplifier according to this embodiment. Further, the loads $Z_1$ and $Z_2$ in the differential amplifier of FIG. 11 are inductors. In FIG. 6, the abscissa represents the frequency and the ordinate represents the small signal gain. As can be seen from FIG. 6, compared to the conventional differential amplifier, the differential amplifier 500 according to this embodiment may achieve a high gain up to a higher frequency.

Figure 7:
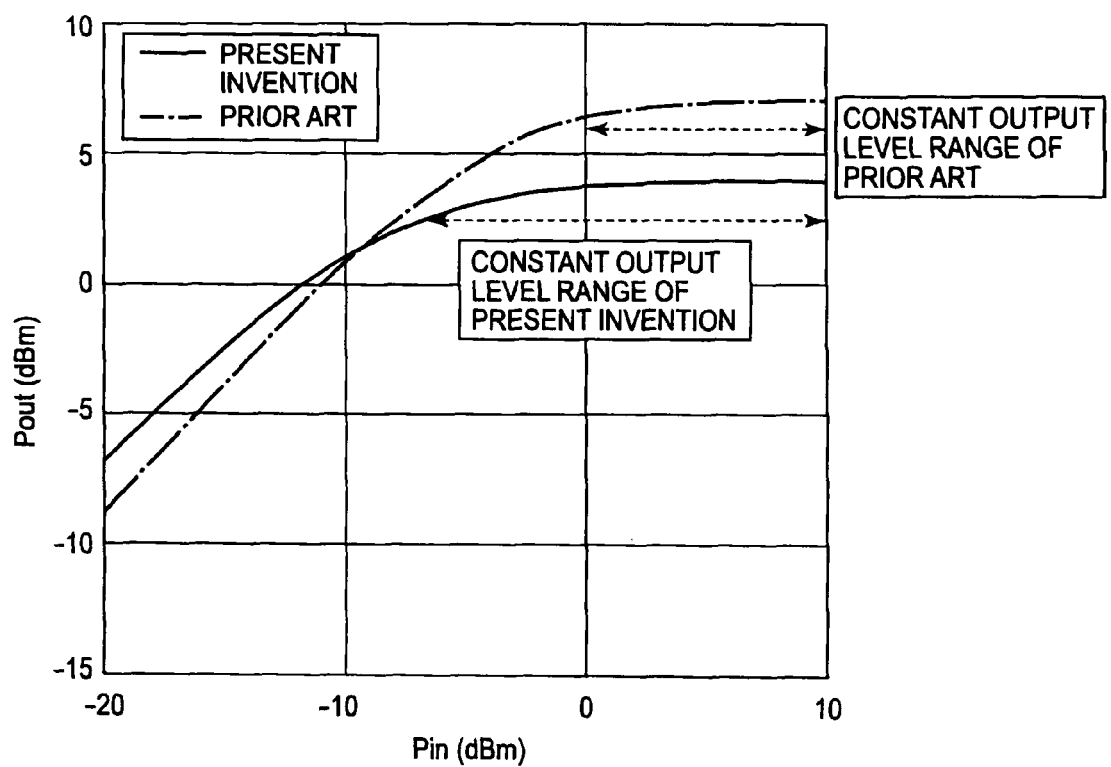
FIG. 7 is a graph illustrating a relationship between a power of an input signal and a power of an output signal of the differential amplifier according to the second embodiment of the present invention.

Further, FIG. 7 illustrates a comparison result of input-output characteristics of the conventional differential amplifier illustrated in FIG. 11 and the differential amplifier 500 according to this embodiment illustrated in FIG. 5. The power supply voltage VDD and the current Ic are identical between the conventional differential amplifier and the differential amplifier according to this embodiment. Further, the loads $Z_1$ and $Z_2$ in the differential amplifier of FIG. 11 are inductors. In FIG. 7, the abscissa represents the power of the input signal, which is input from each of the input terminals Vin+ and Vin−, and the ordinate represents the power of the signal output from each of the output terminals Vout+ and Vout−. As can be seen from FIG. 7, compared to the conventional differential amplifier, the differential amplifier 500 according to this embodiment has a wider range of signal levels in which the power of the signal output from each of the output terminals Vout+ and Vout− is constant. In other words, compared to the conventional differential amplifier, the differential amplifier 500 according to this embodiment illustrated in FIG. 5 may perform the limiter operation in a wider frequency range.

Third Embodiment

Figure 8:
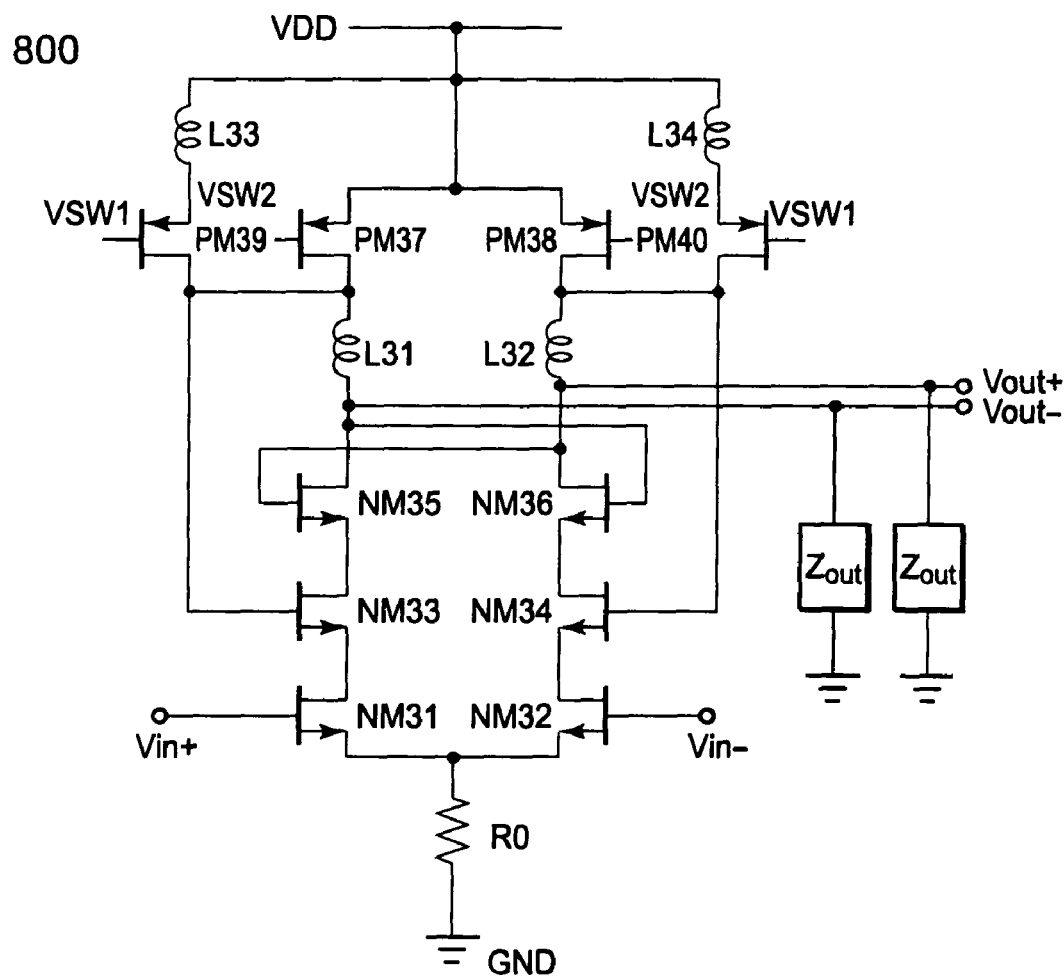
FIG. 8 illustrates a specific configuration example of a differential amplifier according to a third embodiment of the present invention.

FIG. 8 illustrates a differential amplifier 800 according to a third embodiment of the present invention. The differential amplifier 800 according to the third embodiment is different from each of the differential amplifiers according to the first and second embodiments in that inductors and p-type MOS transistors are used in combination as the loads, and a wide frequency band may be covered by switching a load inductance used in an operation of the differential amplifier. In this case, a combination of a PMOS transistor PM37 and an inductor L31 or a combination of an inductor L33 and a PMOS transistor PM39 is the first load circuit. Similarly, a combination of an inductor L32 and a PMOS transistor PM38 or a combination of an inductor L34 and a PMOS transistor PM40 may be the second load circuit. Each of the inductors L31 and L32 is the load inductance to support a high frequency band. On the other hand, each of the inductors L33 and L34 is the load inductance to support a low frequency band. In the differential amplifier 800 according to the third embodiment of the present invention, each of the PMOS transistors is turned ON and OFF by applying a signal VSW2 indicating HIGH or LOW to a gate of each of the PMOS transistors PM37 and PM38 and a signal VSW1 indicating HIGH or LOW to a gate of each of the PMOS transistors PM39 and PM40, to thereby change the number of the inductors to be connected to NMOS transistors NM31 to NM36. When the inductors to be connected to the NMOS transistors NM31 to NM36 are changed, a load inductance value of the differential amplifier 800 is changed, and hence a load impedance is changed to change frequency characteristics of a gain. This is because, as described above, the impedance changes depending on the frequency of the signal handled by the differential amplifier. In recent years, there has been known a system for communications using a wide frequency range as in wireless communications using an ultra wide band (UWB), and hence it is very important also for the differential amplifier to support the wide frequency range.

In this case, when the signal VSW2 indicating LOW is applied to the gate of each of the PMOS transistors PM37 and PM38 to turn ON both the PMOS transistors PM37 and PM38, the signal VSW1 indicating HIGH is applied to the gate of each of the PMOS transistors PM39 and PM40 to turn OFF both of the PMOS transistors PM39 and PM40.

Conversely, when both the PMOS transistors PM37 and PM38 are OFF, the PMOS transistors PM39 and PM40 are ON. Also in the differential amplifier 800, both the NMOS transistors NM33 and NM34 operate in the linear region, and have a function of facilitating a limiter operation by limiting the allowable output operation range based on a negative feedback signal, which is input to a gate of each of the NMOS transistors NM33 and NM34. Further, as in the first and second embodiments, the NMOS transistors NM35 and NM36 have a function of enhancing a small signal gain in a high frequency region with the use of a positive feedback signal, which is input to a gate of each of the NMOS transistors NM35 and NM36.

Figure 9:
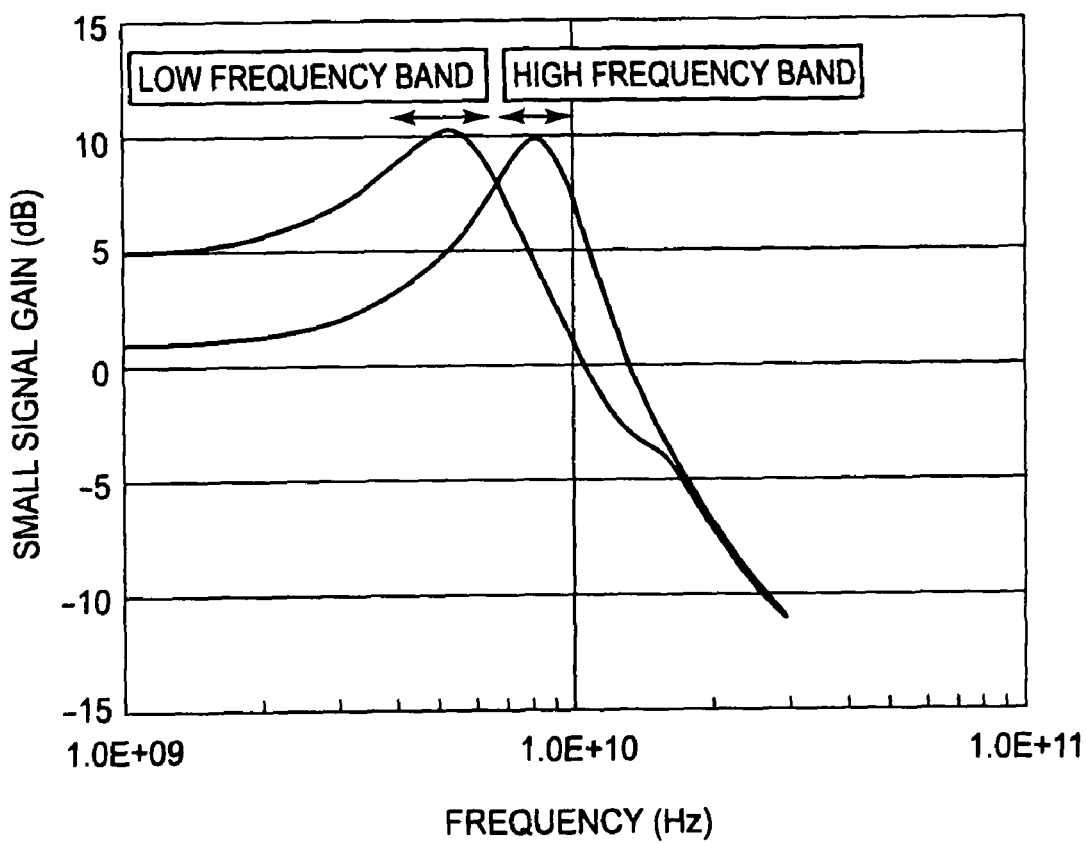
FIG. 9 illustrates a frequency characteristic of a gain of the differential amplifier according to the third embodiment of the present invention.
Figure 10:
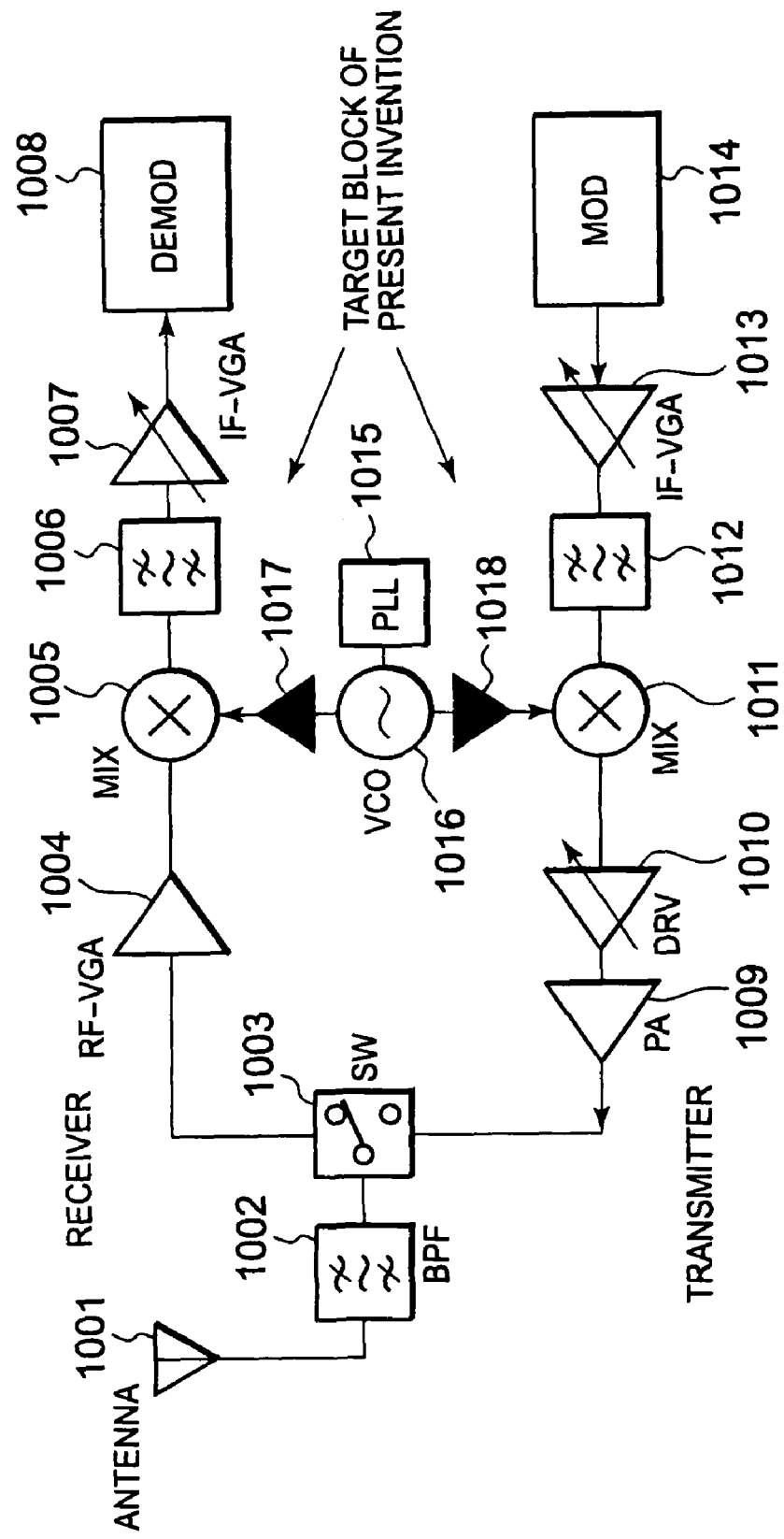
FIG. 10 illustrates a configuration of a wireless communications system that has been conventionally used.

FIG. 9 illustrates a frequency characteristic corresponding to the high frequency band, which is achieved when the PMOS transistors PM37 and PM38 are ON and the PMOS transistors PM39 and PM40 are OFF, and a frequency characteristic corresponding to the low frequency band, which is achieved when the PMOS transistors PM37 and PM38 are OFF and the PMOS transistors PM39 and PM40 are ON. The abscissa represents the frequency and the ordinate represents the small signal gain. It can be seen that a wide high-frequency band may be supported by switching the load inductors as in this embodiment.

The exemplary embodiments of the present invention have been described above, but the scope of the present invention is not limited to the embodiments. Further, in the embodiments, the polarity of each MOS transistor is specified as n-type or p-type, but similar operations may be realized when each MOS transistor has the opposite polarity with respect to the embodiments described above. It is apparent that the present invention is not limited to the above embodiments, but may be modified and changed without departing from the scope and spirit of the invention.

What is claimed is:

1. A differential amplifier, comprising:
   a first signal path extending from a power supply line to a ground line;
   a first MOS transistor for causing a signal flowing through the first signal path to flow between a source and a drain thereof and receiving a first input signal at a gate thereof, the first input signal being amplified by the differential amplifier;
   a second MOS transistor for operating to decrease the signal flowing through the first signal path and passing through a source and a drain thereof when the first MOS transistor operates to increase an amount of the signal flowing through the first signal path and passing through the source and the drain of the first MOS transistor; and
   a third MOS transistor for operating to increase the signal flowing through the first signal path and passing through a source and a drain thereof when the first MOS transistor operates to increase the amount of the signal flowing through the first signal path and passing through the source and the drain of the first MOS transistor.

2. A differential amplifier according to claim 1, wherein the second MOS transistor operates in a linear region.

3. A differential amplifier according to claim 2, wherein the third MOS transistor operates in a saturation region.

4. A differential amplifier according to claim 3, further comprising:
   a second signal path extending from the power supply line to the ground line, which is different from the first signal path; and
   a fourth MOS transistor for causing a signal flowing through the second signal path to flow between a source and a drain thereof and receiving a second input signal at a gate thereof, the second input signal having a phase different from the first input signal and being amplified by the differential amplifier, the signal flowing through the second signal path having an opposite phase to the signal flowing through the first signal path.

5. A differential amplifier according to claim 4, wherein the first input signal has the same phase as the signal flowing through the second signal path, and the second input signal has the same phase as the signal flowing through the first signal path.

6. A differential amplifier according to claim 1, further comprising a first load circuit for receiving the signal flowing through the first signal path,
   wherein the first load circuit includes a resistor.

7. A differential amplifier according to claim 1, further comprising a first load circuit for receiving the signal flowing through the first signal path,
   wherein the first load circuit includes an inductor.

8. A differential amplifier according to claim 7, wherein a number of the inductors included in the first load circuit and connected to the third MOS transistor is changeable.

* * * * *